(12) United States Patent
Ghannouchi et al.

(10) Patent No.: US 11,296,657 B2
(45) Date of Patent: Apr. 5, 2022

(54) SYSTEM AND METHOD FOR RF AMPLIFIERS

(71) Applicants: Fadhel Ghannouchi, Calgary (CA); Andrew Kwan, Calgary (CA); Mayada Younes, Calgary (CA); Mohamed Helaoui, Calgary (CA)

(72) Inventors: Fadhel Ghannouchi, Calgary (CA); Andrew Kwan, Calgary (CA); Mayada Younes, Calgary (CA); Mohamed Helaoui, Calgary (CA)

( * ) Notice: Subject to any disclaimer, the term of this patent is extended or adjusted under 35 U.S.C. 154(b) by 59 days.

(21) Appl. No.: 16/522,080

(22) PCT Filed: Feb. 15, 2018

(86) PCT No.: PCT/CA2018/000029
§ 371 (c)(1),
(2) Date: Jul. 25, 2019

(87) PCT Pub. No.: WO2018/148822
PCT Pub. Date: Aug. 23, 2018

(65) Prior Publication Data
US 2020/0021253 A1 Jan. 16, 2020

Related U.S. Application Data

(60) Provisional application No. 62/459,403, filed on Feb. 15, 2017.

(51) Int. Cl.
*H03F 1/32* (2006.01)
*H03F 3/30* (2006.01)
*H03F 3/20* (2006.01)
*H03F 3/189* (2006.01)

(52) U.S. Cl.
CPC ............. *H03F 1/3247* (2013.01); *H03F 3/20* (2013.01); *H03F 2200/129* (2013.01); *H03F 2200/451* (2013.01); *H03F 2201/3224* (2013.01); *H03F 2201/3233* (2013.01)

(58) Field of Classification Search
CPC .... H03F 1/3247; H03F 3/20; H03F 2200/129; H03F 2200/451; H03F 2201/3224; H03F 2201/3233; H03F 1/3241; H03F 3/189; H03C 1/06
USPC ........................................................ 330/149
See application file for complete search history.

(56) References Cited

U.S. PATENT DOCUMENTS 9,659,120 B2 * 5/2017 Fehri ................. H03F 3/189
2014/0333376 A1 * 11/2014 Hammi ............ H03F 1/3258
330/149

* cited by examiner

*Primary Examiner* — Hieu P Nguyen

(57) ABSTRACT

A digital predistorter comprising a first predistorter for generating out-of-band and inter-band distortion components for compensating for the static nonlinearity of a nonlinear element, and a second predistorter cascaded with the first predistorter, the second predistorter compensating for the in-band distortion of the nonlinear device wherein the cascade of the first predistorter and the second predistorter compensate for in-band, out-of-band and inter-band distortions when the cascade of the first, the second predistorter and the nonlinear element are driven with multiband signals.

13 Claims, 8 Drawing Sheets

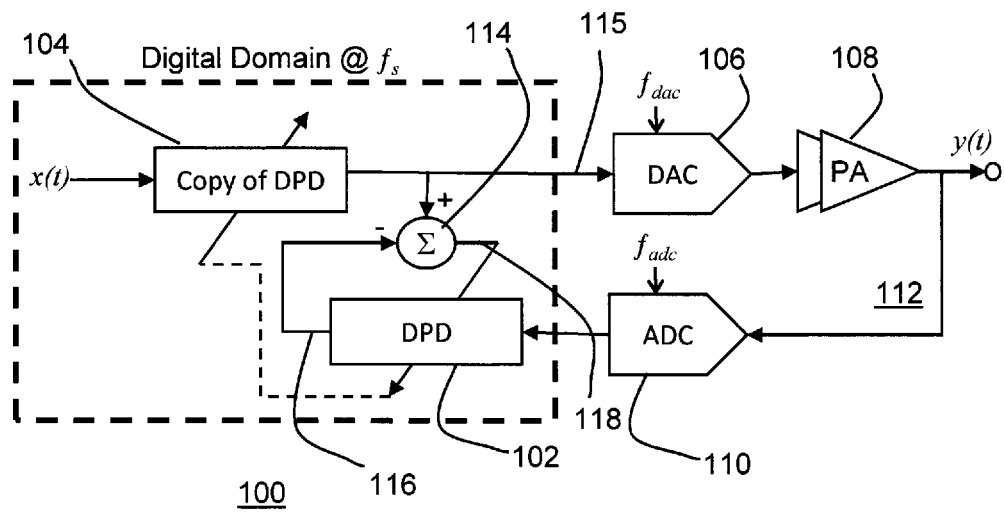
Fig. 1
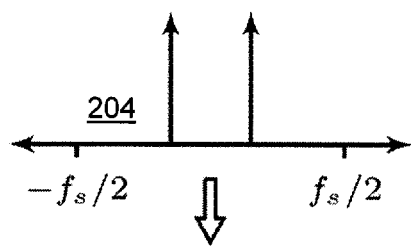
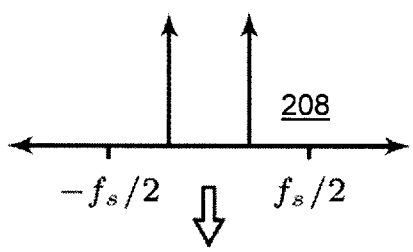
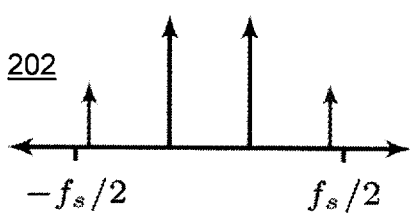
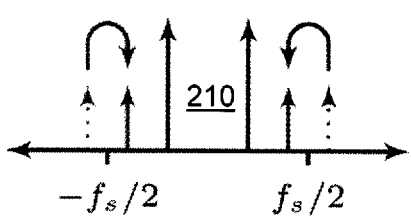
Fig. 2A            Fig. 2B

A

B

C

SYSTEM AND METHOD FOR RF AMPLIFIERS

FIELD

The present matter is directed to systems and methods for distortion suppression in high efficiency, high power RF amplifiers.

BACKGROUND

In signal processing systems any nonlinearity in a signal path may distort a desired output signal. This distortion may manifest as, for example, gain compression or expansion (sometimes called amplitude-to-amplitude (AM-AM) distortion), phase distortion (sometimes called amplitude-to-phase (AM-PM distortion) or unwanted frequencies (spurious outputs or spurs) in the output spectrum. For single input signals, distortion appears at harmonic frequencies, creating harmonic distortion (HD). With multiple input signals, in-band distortion at frequencies not just at harmonic frequencies of the input signals is created, called intermodulation distortion (IMD).

Spectral regrowth is a significant distortion mechanism in nonlinear devices, particularly for power amplifiers (PAs) handling varying envelope signals in applications such as wireless. Spectral regrowth, is a phenomenon that occurs if a band-limited time-varying envelope signal is passed through a nonlinear circuit. In other words, when the gain is no longer constant with input power. In this situation, the output spectrum is wider than the input spectrum, "spectral regrowth", and co-channel and adjacent-channel distortion result. As the number of bands increase at the input of the PA, more IMD products will be generated at the output of the PA.

Nonlinear operation usually lies at a very highly efficient region of the PA operating point. Linearization techniques such as digital predistortion (DPD) exploit this phenomenon and may compensate for the spectral regrowth by distorting the original input signal with an inverse of the PA nonlinearities, such that the cascade of both the predistorter and the PA results in a quasi-linear system.

DPD is well-established for simple, single carrier transmitter systems. With the demand for greater throughput, transmitter schemes utilize multi-band carrier aggregation to increase data throughput. Typically, these bands are far apart in frequency and use parallel transmit channels to transmit signals in each band concurrently. An effective way to reduce cost and design space is to combine the low power multiband RF signals, and amplify all the signals together using a multiband enabled PA. However, multi-band signals passed through a nonlinear device introduce additional complex challenges, such as producing IMD products at frequencies other than at the main transmit channels.

In general, a multiband DPD enabled system should have low distortion in the in-band and out-of-band channels, while exhibiting high operating efficiency. Suppression or rejection of the IMD components in digital baseband are described in literature and fall into two categories: capturing and modeling the output of the distortion, or prediction of the distortion through the capture of the main bands. Furthermore, depending on the desired suppression scenario these techniques may require increased transmitter/receiver sampling rates.

SUMMARY

In accordance with an embodiment of the present matter there is provided a digital predistorter for suppressing intermodulation distortions comprising a first predistorter compensating for a first nonlinearity in a nonlinear element when driven with first characterizing signals, and a second predistorter compensating for a second nonlinearity in the nonlinear element when driven with second characterizing signals, wherein distortions in an output signal are suppressed when a connected combination of the first predistorter, the second predistorter, and the nonlinear element are driven with an input signal.

In accordance with an aspect of the embodiment the first predistorter being a static predistorter.

In accordance with another aspect of the embodiment there is further provided a feed back loop, the feedback loop including the second predistorter.

In accordance with another aspect the feedback loop is a low speed feedback loop used to train the second predistorter.

In accordance with another aspect the combination of the first and second predistorters compensate for memory effects.

In accordance with another aspect the second predistorter compensates for memory effects and dynamic nonlinearity effects in transmitted channels.

In accordance with a further aspect the first predistorter generating out-of-band and inter-band distortion components for compensating for the static nonlinearity.

In accordance with a further aspect the distorter compensates for in-band, out-of-band and inter-band distortions when the cascade of the first, the second predistorter and the nonlinear element are driven with multiband signals.

In accordance with another embodiment of the present matter there is provided a method for suppressing intermodulation distortion caused by nonlinear power amplifiers comprising generating a narrowband static predistorter for the power amplifier; predistorting an input signal in a predistorter; and applying a predistorted version of the input signal to the static predistorter connected in combination with the power amplifier.

In accordance with a further aspect the signal is one of multiband, wideband and single band.

In accordance with a further aspect the amplifier is one of multiband, wideband and single band.

In accordance with a further aspect the multiband signals are resampled and shifted into their respective carrier frequencies before being applied to the static predistorter.

BRIEF DESCRIPTION OF THE DRAWINGS

The present matter will become more fully understood from the detailed description and the accompanying drawings, wherein:

FIG. 1 shows a conceptual block diagram of a single band DPD with a feedback loop;

FIGS. 2A and 2B show example output distortion generation by a two-tone baseband input signal at different processing rates;

DETAILED DESCRIPTION

Figure 3:
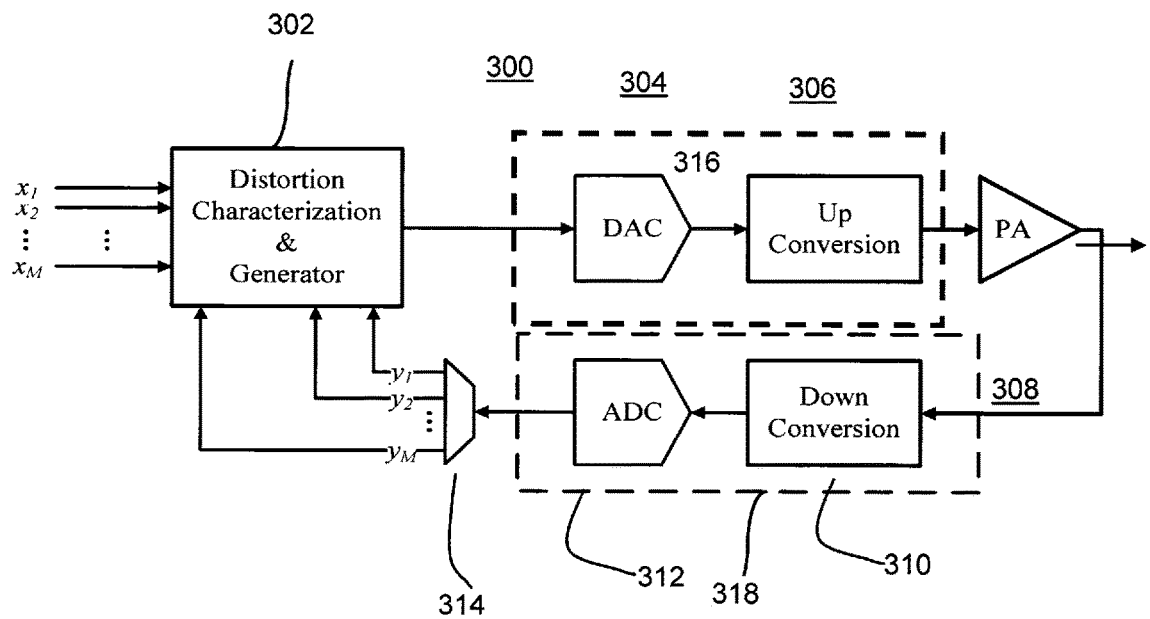
FIG. 3 shows a block diagram of a distortion compensation system according to one embodiment of the present matter.

The present matter provides a digital predistorter comprising a first predistorter compensating for a first nonlinearity in a nonlinear element driven when driven by first characterizing signals, and a second predistorter compensating for a second nonlinearity in the nonlinear element when driven by second characterizing signals, wherein distortions in an output signal are suppressed when a connected combination of the first predistorter, the second predisorter, and the nonlinear element are driven with an input signal.

The present matter further provides a method for suppressing distortion components in a signal caused by nonlinear elements in a system comprising: generating a first model compensating for a static nonlinearity of the nonlinear element and generating a second model compensating for a nonlinearity in a cascaded combination of the first model and the nonlinear element. The method further provides for suppressing distortion in the system by first passing multiband signals through a cascaded combination of the first and second models.

The present matter further provides a method for suppressing distortion components in a signal caused by nonlinear elements in a system, as for example those caused by nonlinear power amplifiers. In one embodiment the method provides for rejecting intermodulation distortion caused by multi-band power amplifiers with minimal modeling complexity by generating a static predistorter for the power amplifier; resampling and shifting intended multi-band signals into their representative carrier frequencies before applying the generated static predistorter to accommodate intermodulation distortion products produced by the nonlinearity.

In instances where for example a resampling frequency may be high, an embodiment of the present matter further provides a method, using filtering techniques to represent low bandwidth transmitter schemes.

In general, the present matter provides for the use of a static predistortion to generate the inverse of the spurious distortion components (inter-band and out of band distortion) of the ones that will be generated by the power amplifier (PA) to reduce the spurious distortion components at the output of the PA when driven with multi-carrier signals.

The present embodiments address some of the problems due to intermodulation products, caused by nonlinear devices, which increase as the number of main transmitted channels increase, and their location on the frequency spectrum depend on the frequency spacing between the channels. With multi-band predistortion, prior architectures assume that a bandpass filter is present to filter out these components before transmitting into the wireless channel. In some instances, this filter is ineffective and the IMD components leak into the receiver path, causing receiver desensitization.

Removal of these distortions entail capturing and modeling the distortion products to remove their effects. In addition, spectral regrowth overlap can be encountered when main channels (or bands) are close together which causes significant performance issues for DPD, since multi-band DPD algorithms cannot distinguish which signal is in their respective band. DPD implementation of multi-band transmitter architectures also increases the complexity and cost of these systems. A feedback loop which is used in these DPD, is a costly part of these predistortion systems, and ways of reducing the cost through sampling frequency reduction techniques as for example, use of a single subsampling receiver to capture multi-band signals concurrently for the purpose of training the predistorter, or to alias the PA outputs on top of each other and use signal processing techniques to extract the proper predistorter model. Other techniques may use a single channel multi-stage predistorter and an offline-trained static predistorter to compensate for severe nonlinearities, and to, in turn, use a reduced feedback rate since the nonlinearity of the static predistorter/PA cascade is reduced.

In general, the present matter provides for a DPD-enabled system having low distortion in the in-band and out-of-band channels, while exhibiting high operating efficiency. One embodiment of the present matter provides a multi-band predistortion system with selective IMD suppression for linearization of PAs. In another embodiment the system provides for one or more of IMD compensation without direct signal capturing and modeling, reducing possible transmitter/receiver sampling rate depending on the required suppression scenario, and finding a generic basis function from the IMD basis functions and reduced cost to implement DPD architecture.

Referring to FIG. 1 there is shown a conceptual block diagram of the DPD architecture 100. The single band DPD architecture 100 includes a digital predistortion (DPD) block 102, a copy 104 of the DPD block 102, a digital-to-analog converter (DAC) 106, a multibranch power amplifier (PA) 108, an analog-to-digital converted (ADC) 110, and summer 114. The DPD's implement typical complementary nonlinear functions that are configured to cancel out the distortions created by the PA. An input signal x(t) is applied to the DPD block 104, the output of which is a predistorted signal 115 is converted through DAC 106 and fed to the appropriate input branches of the multibranch PA 108. In single band digital predistortion architecture 100, as illustrated, a feedback loop 112 captures a portion of the output signal y(t) of the PA 108 which is digitized by the ADC 110 to provide an input signal to the DPD 102, which is trained through an error feedback signal. In other words, the summer 114 is connected to provide an output DPD error signal 118 from the predistorted signal 115 and the predistorted feedback signal 116. The DPD 102 is then used to update the DPD 104.

In the DPD architecture 100 there are several frequencies that can be identified:

$f_{dac}$: sampling rate of the DAC
$f_{adc}$: sampling rate of ADC utilized in the feedback loop
$f_s$: signal processing rate of the DPD Signal bandwidth: This refers to the bandwidth of the signal to be transmitted which is applied at the input of the predistorter For traditional predistortion schemes the sampling rates are all equal. As wireless standards become more complex and define wider bandwidth and multi-band transmitter capabilities, the sampling rate requirements increase dramatically when following this convention. Decoupling of the dependencies between these parameters may be advisable for digital predistortion to be viable in wideband and multi-band scenarios. For DPD applications, it is imperative to have a signal processing rate, fs, which can handle the spectral regrowth of the predistorter output. To illustrate the impact of a low signal processing rate, FIGS. 2A and 2B shows respective cases of a two tone baseband signal passed through a 3rd order nonlinear function with different $f_s$. The signal processing rate fs is determined by the spectral regrowth components of the DPD output, as for example illustrated in FIG. 2A. FIG. 2A shows output spectral regrowth frequency components 202 when a two-tone baseband signal 204 is passed through a 3rd order nonlinear function block 206. In contrast FIG. 2B illustrates the impact of choosing a lower signal processing rate for fs when the same two-tone baseband signal 208 is passed through the 3rd order nonlinear function block 206. As may be seen from the output spectrum 210, the chosen lower signal processing rate cannot accommodate the IMD generated components. Thus, creating a minimum threshold on the processing rate fs. As illustrated in 210, the output spectral information aliases back into the band information. The output frequency components shown by the dashed lines in 210 are incorrect at the two frequency locations and thus the linearization performance of the DPD suffers. These output IMD products will increase depending on the degree of nonlinearity and requiring a higher fs to mitigate this. In addition, for multi-band applications, the signal frequency separation between the input multiband signals at the input of the nonlinear block may increase depending on the application, further increasing the minimum processing rate fs. Therefore, multi-band DPD techniques are suggested to eliminate this frequency requirement, and instead focuses on spectral regrowth compensation in the target channel. In other words, multi-band DPD (MB-DPD) techniques that have been proposed for multi-band signal driven transmitter scenarios require the capture and processing of each channel separately and hence reducing the processing and converter (DAC and ADC) speeds when compared with single band DPD. However, MB-DPD inherently may not mitigate the problem of spurious distortion (out of band and inter-band) distortion.

To better understand the derivation of multiband intermodulation products, reference is made to a general memoryless bandpass nonlinear transmitter model which can be represented by the following polynomial equation:

$$y(t) = \sum_{k=1}^{N} a_k x^k(t) \quad (1)$$

where N is the polynomial order, $(a_1 \ldots a_k \ldots a_N)$ is the set of bandpass model coefficients, y(t) is the bandpass model output signal, and x(t) is the bandpass input signal.

In the case of a multi-band transmitter, the bandpass model input can be represented as:

$$x(t) = \sum_m \Re[\tilde{x}_m(t) e^{j\omega_m t}] \quad (2)$$

where $\omega_m$ is the angular carrier frequency, $\tilde{x}_m(t)$ is the complex envelope of the bandpass signal $x_m(t)$, and $t=nTs=1/fs$ is the sampling time interval. The complete bandpass output, y(t), where M is the number of inputs, is related to the bandpass M inputs as follows:

$$y(t) = \sum_{k=1}^{N} a_k \left( \sum_{m=1}^{M} x_m(t) \right)^k \quad (3)$$

Therefore, y(t) can be expressed as:

$$y(t) = \sum_{k=1}^{N} \sum_{r_1=0}^{k} \sum_{r_2=0}^{r_1} \ldots \sum_{r_{M-1}=0}^{r_{M-2}} a_k C_{r_1}^k C_{r_2}^{r_1} \ldots C_{r_{M-1}}^{r_{M-2}} \times \quad (4)$$

$$(x_1(t))^{k-r_1} (x_2(t))^{r_1-r_2} \ldots (x_M(t))^{r_{M-2}-r_{M-1}}$$

The complex representation of the bandpass signal x(t) in terms of its complex envelope $\tilde{x}(t)$ is:

$$x(t) = \tfrac{1}{2}[\tilde{x}(t) e^{j\omega t} + \tilde{x}^*(t) e^{-j\omega t}] \quad (5)$$

where the complex envelope $\tilde{x}(t)$ can be represented as $\tilde{x}(t) = X(t) e^{j\Theta(t)}$, where X(t) and $\Theta(t)$ are the instantaneous amplitude and phase of $\tilde{x}(t)$, respectively. Replacing the bandpass M signals with their complex representations results in:

$$y(t) = \sum_{k=1}^{N} \sum_{r_1=0}^{k} \sum_{r_2=0}^{r_1} \ldots \sum_{r_{M-1}=0}^{r_{M-2}} \frac{1}{2^k} a_k C_{r_1}^k C_{r_2}^{r_1} \ldots C_{r_{M-1}}^{r_{M-2}} \times \quad (6)$$

$$\sum_{k_1=0}^{k-r_1} \sum_{k_2=0}^{r_1-r_2} \ldots \sum_{k_M=0}^{r_{M-2}-r_{M-1}} C_{k_1}^{k-r_1} C_{k_2}^{r_1-r_2} \ldots C_{k_M}^{r_{M-2}-r_{M-1}} \times$$

$$(\tilde{x}_1)^{k-r_1-k_1} (\tilde{x}_1^*)^{k_1} (\tilde{x}_2)^{r_1-r_2-k_2} (\tilde{x}_2^*)^{k_2} \times \ldots$$

$$(\tilde{x}_M)^{r_{M-2}-r_{M-1}-k_M} (\tilde{x}_M^*)^{k_M} \times e^{j\omega_1(k-r_1-2k_1)t}$$

$$e^{j\omega_2(r_1-r_2-2k_2)t} \times \ldots e^{j\omega_M(r_{M-2}-r_{M-1}-2k_M)t}$$

Basis functions for the terms around the different angular frequencies and different IMD bands can be deduced from the general multi-band model represented in equation (4). By organizing the terms around the different frequency bands, the IMD terms can be organized as follows:

$$\text{Main Carrier Bands} \begin{cases} \tilde{x}_1(t) \prod_{m=1}^{M} |\tilde{x}_m(t)|^{2k_m} e^{j\omega_1 t} \\ \tilde{x}_2(t) \prod_{m=1}^{M} |\tilde{x}_m(t)|^{2k_m} e^{j\omega_2 t} \\ \vdots \\ \tilde{x}_M(t) \prod_{m=1}^{M} |\tilde{x}_m(t)|^{2k_m} e^{j\omega_M t} \end{cases}$$

$$IMD3 \begin{cases} \tilde{x}_1^* \tilde{x}_2^2 \prod_{m=1}^{M} |\tilde{x}_m(t)|^{2k_m} e^{j(2\omega_2 - \omega_1)t} \\ \tilde{x}_1^2 \tilde{x}_2^* \prod_{m=1}^{M} |\tilde{x}_m(t)|^{2k_m} e^{j(2\omega_1 - \omega_2)t} \\ \tilde{x}_1 \tilde{x}_2^* \tilde{x}_3 \prod_{m=1}^{M} |\tilde{x}_m(t)|^{2k_m} e^{j(\omega_1 - \omega_2 + \omega_3)t} \\ \vdots \end{cases}$$

$$IMD5 \begin{cases} \tilde{x}_1^3 \tilde{x}_2^{*2} \prod_{m=1}^{M} |\tilde{x}_m(t)|^{2k_m} e^{j(3\omega_1 - 2\omega_2)t} \\ \tilde{x}_2^3 \tilde{x}_3^{*2} \prod_{m=1}^{M} |\tilde{x}_m(t)|^{2k_m} e^{j(3\omega_2 - 2\omega_3)t} \\ \tilde{x}_1^2 \tilde{x}_2^{*2} \tilde{x}_3 \prod_{m=1}^{M} |\tilde{x}_m(t)|^{2k_m} e^{j(2\omega_1 - 2\omega_2 + \omega_3)t} \\ \tilde{x}_1^3 \tilde{x}_2^* \tilde{x}_3^* \prod_{m=1}^{M} |\tilde{x}_m(t)|^{2k_m} e^{j(3\omega_1 - \omega_2 - \omega_3)t} \\ \vdots \end{cases}$$

From the previous equation, the amount of distortion increases as the number of bands increase, or when the nonlinearity order of the transmitter increases. These derivations are the basis of IMD suppression techniques. Traditionally, IMD suppression techniques rely on the decomposition of the wideband representation given in (1) to target IMD suppression in their respective bands.

In the present system and method described herein, the nonlinear transmitter model is used to generate these IMD components, while removing or reducing the modelling complexity for each IMD product. This provides one or more of a reduction of the sampling rate at the feedback receiver (feedback loop) for multi-band DPD; and no prerequisite to capture and model the individual IMD components. In other words, the IMD suppression technique is generic, and does not require analysis of a specific IMD product to be compensated. If the processing rate is high enough, IMD predistorter products may be generated; and frequency independence of the RF carrier locations in multi-band transmission. Since multiband DPDs have modeling difficulty when the main channels' spectral regrowth overlaps.

In a generalized multistage DPD architecture as the number of bands increase at the input of the PA, more IMD products will be generated at the output of the PA. Suppression of these IMD components without capturing these signals is desired and may reduce the amount of feedback receivers required.

Referring now to FIG. 3 there is shown a block diagram of a distortion compensation system 300 according to one embodiment of the present system and method. The system 300 includes a distortion compensation block 302 for distortion characterization and generation, a DAC 304, an up-conversion block 306, a PA, and a feedback loop 308 having a down conversion block 310, an ADC 312 and demultiplexer 314. Input signals $x_1, x_2 \ldots x_M$ are input to the distortion compensation block 302 the output of which is digitized by DAC 304 and up-converted by up-conversion block 306 before being fed to the power amplifier PA. The feedback loop 308, connected from the output of the PA, down converts the feedback portion of the PA output signal in down-converter 310 which is then passed to ADC 312 which outputs digital signals to demultiplexer 314, which in turn feeds signals $y_1, y_2, \ldots y_M$ to the distortion compensation block 302 to synthesize static and multi-band predistorters, as will be described in more detail below. In general, the high speed down conversion block 316 can be replaced by a frequency de-multiplexer to separate the different channels followed by low-speed ADCs, or block 318 can also be replaced as well with sub-sampling receiver requiring a low to moderate speed ADC. The output signals from the distortion compensation block 302 may be connected to the DAC and up converted, by for example using broadband converter and high-speed DAC or low speed DACs followed by multi-branch converters and a broadband power combiner, and fed to the input of the PA.

Figure 4:
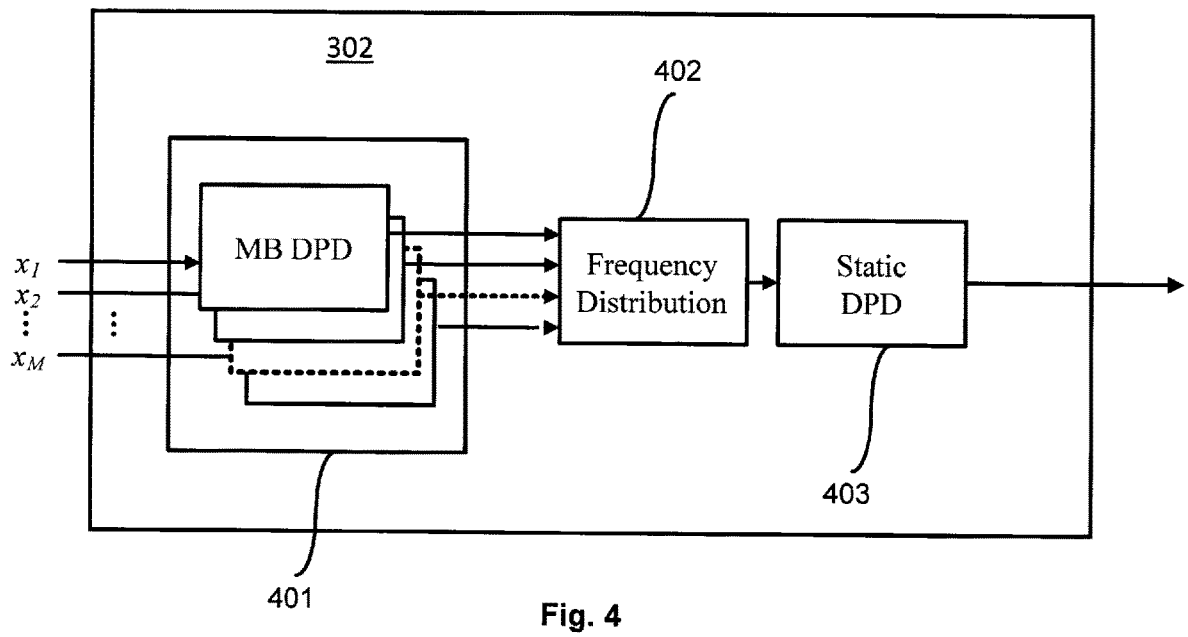
FIG. 4 shows a block diagram of an implementation of a distortion compensation block according to an embodiment of the present matter.

Referring to FIG. 4 there is shown a block diagram of an implementation of the distortion compensation block 302 according to an embodiment of the present matter. The distortion compensation block is comprised of a multi-stage DPD architecture that combines a static DPD 403 to generate, mitigate, and compensate for the inter-band, out of band, and spurious distortions at the output of the PA; a multi-band DPD (MB DPD) 401 to compensate for the in-band distortion and distortion close to the channels of the multi-band signal; and a frequency distribution block 402 for positioning the output multiband predistorted signals into their representative carrier frequencies The static DPD 403 is a memoryless predistorter which is first synthesized or characterized with a narrow band or CW signal to model the inverse of the static nonlinearity of the PA, and can be represented for example by a look up table (LUT). Memory and other dynamic nonlinearity effects are compensated using a secondary block, the MB DPD 401, which in the illustrated embodiment precedes the static DPD block 403. The static DPD block 403 is used to form the multi-band signal from the multiple baseband output signals of the MB DPD block 401 in the frequency domain in their respective digital intermediate frequencies (IF) ($w_1, w_2, \ldots, w_M$). The cascade of the memoryless (static) predistorter 403 and the PA may be considered as a one mildly nonlinear block by the MB DPD compensator 401. In addition, since much of the nonlinearity is removed once the static DPD 403 is applied, the expected spectral regrowth is less, and slower ADCs may be used in the feedback loop.

The static-nonlinearity function depends only on the current sample due to its memoryless nature; therefore, there is no constraint on the sampling rate for the synthesis of the predistorter. Hence, multi-band signals can be positioned at their respective digital intermediate frequencies (IF) ($w_1, w_2, \ldots, w_M$), and the nonlinearity will be able to generate these IMD components. A consideration is to resolve and select a sampling frequency high enough such that aliasing does not occur when synthesizing the multi-band signals. But it does not have to equal the frequency separation between the distortion frequencies being considered.

Figure 5:
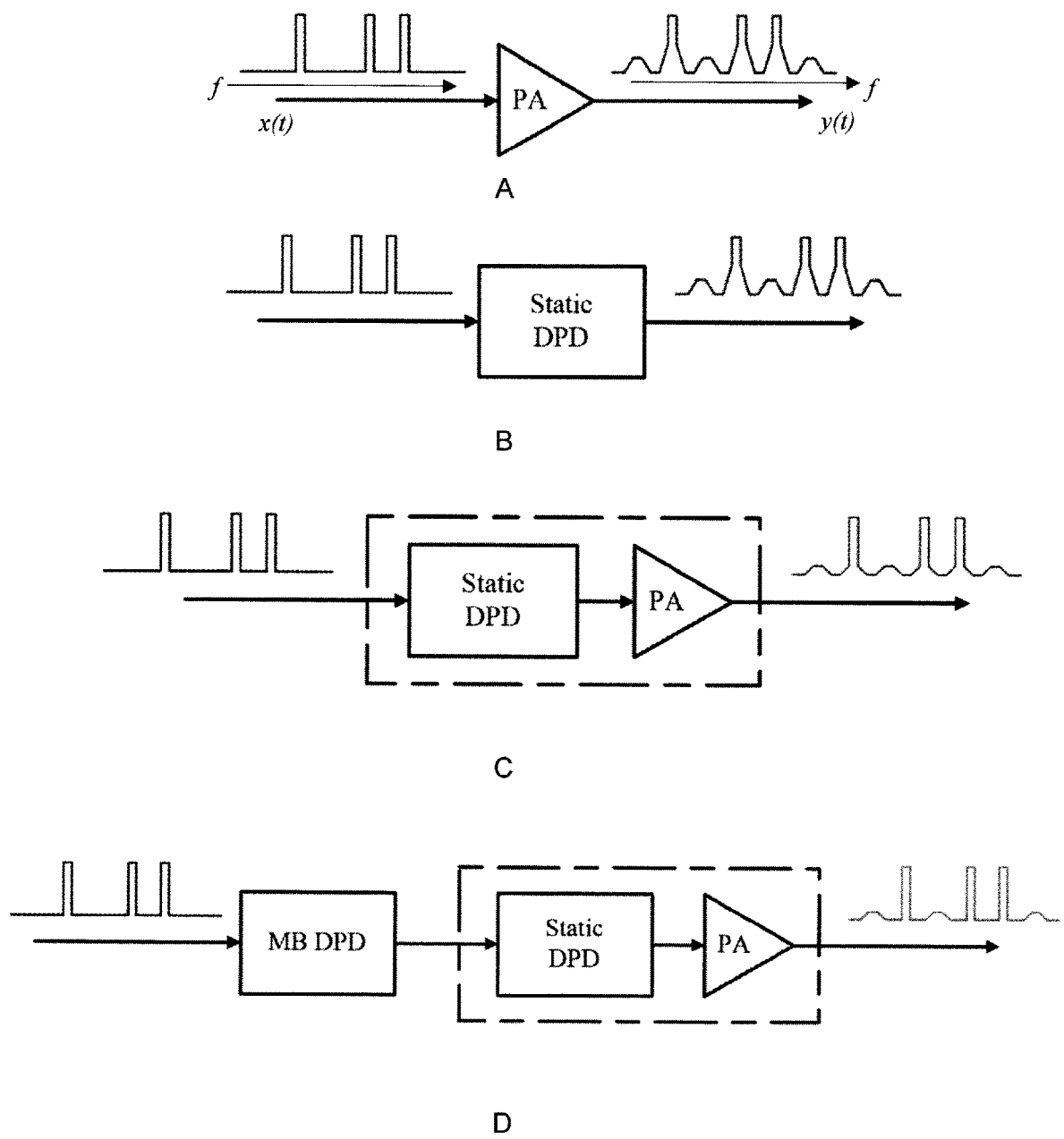
FIGS. 5A-5D show distortion compensation for multiband signals, according to an embodiment of the present matter.

Referring to FIGS. 5A-5D there is shown the frequency spectra at different points along a signal path in the example DPD architecture according to an embodiment of the present matter when fed by a multiband signal, in the illustrated example this is a triband input signal. In FIG. 5A there is shown, the predicted spectra regrowth at the output of the PA when fed by the triband signal without distortion compensation. In FIG. 5B there is shown spectral regrowth at the output of the static nonlinearity block (static DPD), represented by a look up table when fed with the triband signal. In FIG. 5C there is shown spectral regrowth in the output signal with a cascade of the PA and the static DPD when fed with the triband signal and in FIG. 5D there is shown spectral regrowth in the output signal from the amplifier with a multi-band digital predistorter block MB DPD upstream from the LUT static DPD and PA block. As may be seen, the spectral regrowth from the IMD components are reduced.

It may be seen that in the present architecture, the added synthesis of the IMDs that are generated with the static predistorter mitigate the out of band and inter-band intermodulation when the multi-band signal excites the static linearized PA block (Static DPD+PA). Since the static predistorter is memoryless, sampling rates can be changed without consequence to the DPD model. In contrast, prior techniques for IMD compensation utilize the capture of the distortion at each frequency band and synthesize a compensation signal to be injected at the input of the PA. Whereas, in the present systems and methods, as the combined multi-band input signals pass through the static nonlinearity, the sampling rate chosen increases, forcing the transmitter to be wide enough for sending the combined signals. To lessen the speed requirement, each band and IMD product (or grouped multiple close by spaced signals) can be sent through a separate transmitter, which can be done by filtering the output after the LUT and sending each of them through a separate digital to analog (DAC) converter. In addition, the sampling frequency may be reduced at the transmitter level by utilizing the same technique sub-sampling as in for example described in S. A. Bassam, A. Kwan, W. Chen, M. Helaoui, and F. M. Ghannouchi, "Subsampling feedback loop applicable to concurrent dual-band linearization architecture," IEEE Trans. Microw. Theory Techn, vol. 60, no. 6, pp. 1990-1999, June 2012, incorporated herein by reference, to force unwanted aliases to be located on top of each other in the frequency domain.

Figure 6:
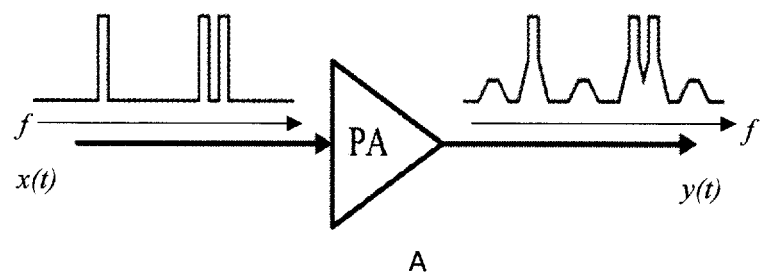
FIGS. 6A-6B show distortion compensation, for spectral regrowth due to band overlap, according to an embodiment of the present matter.
Figure 6:
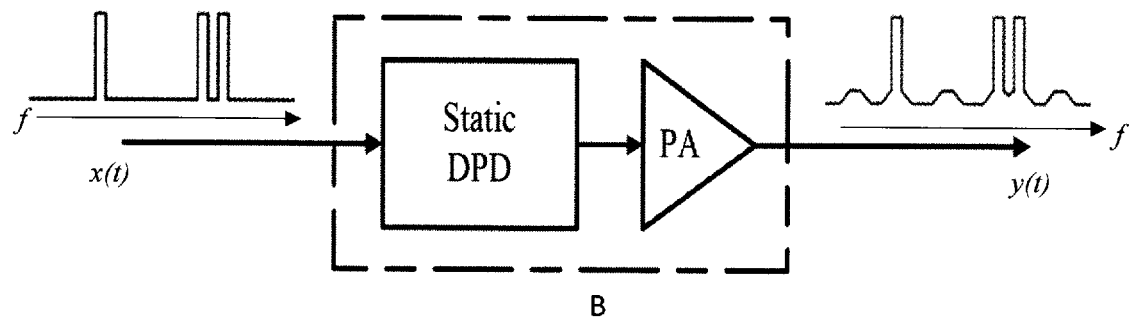

Referring to FIG. 6A there is shown an example of where the spectral regrowth caused by the nonlinear device overlaps with another band. In this case, using just multi-band digital predistortion is not as effective as it is difficult to distinguish the individual frequency outputs. However, by using a static predistorter according to the present disclosure allows the spectral regrowth to be sufficiently reduced such that the multi-band DPD models may be used. FIG. 6B shows an implementation of a static predistorter which allows the overlap to be reduced, thereby enabling effective use of a multi-band DPD in cascade.

Figure 7:
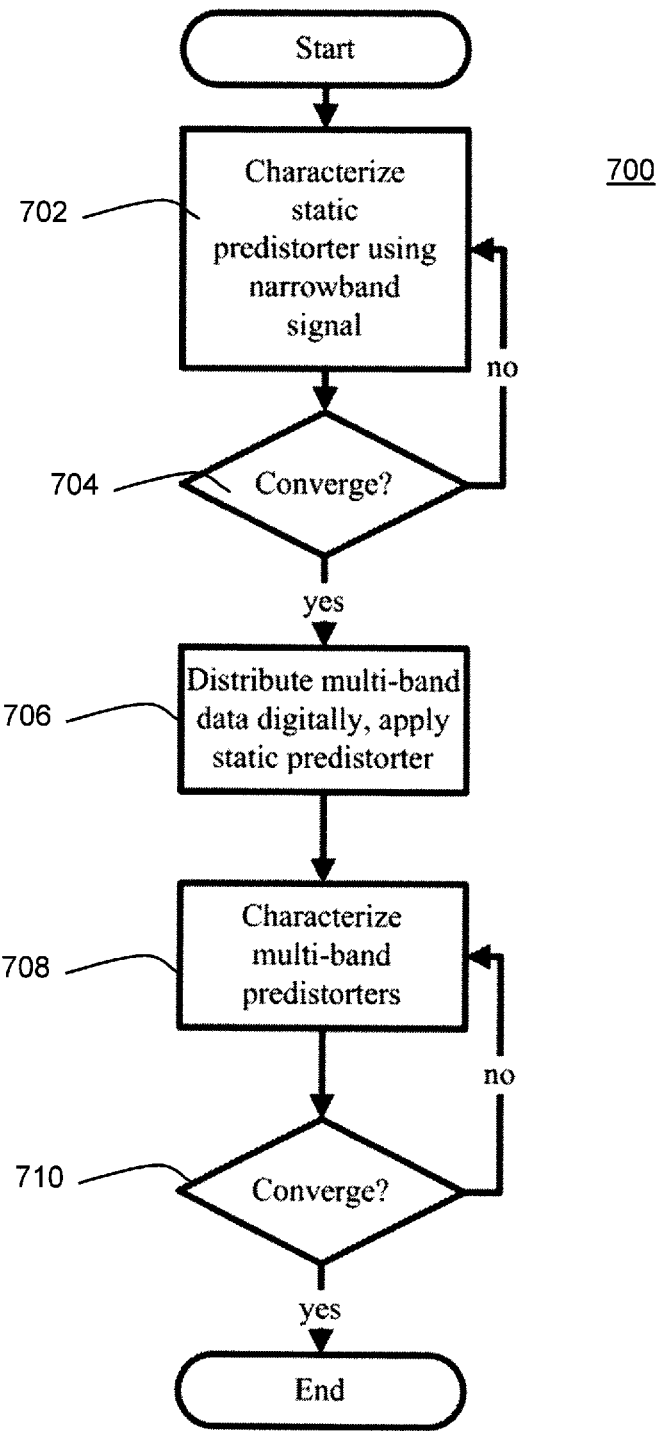
FIG. 7 shows a flow chart for distortion compensation according to an embodiment of the present matter.

Referring now to FIG. 7 there is illustrated a flow diagram of the multi-stage DPD according to an embodiment of the present matter. At block 702 a static predistorter is characterized for the power amplifier by using a narrowband signal. Then, the characterized static DPD is kept constant, and the multi-band signals [$x_1, x_2 \ldots x_M$] are resampled and distributed in the frequency domain to synthesize the passband multiband predistortion signals 706. The out-of-band and inter-band intermodulation distortion products are generated from the mixing of the multi-band input signals by the static DPD. Each of the individual frequency bands may be further improved through adaptive multi-band digital predistortion. Convergence criterion 704, 710 as shown in FIG. 7 is achieved when for example, the in-band distortion reduction (quantified with error vector magnitude or EVM metrics) and close-by and out-of-band distortion reduction (quantified using adjacent-channel power ratio (ACPR) or C/IMD metrics) meet Standards requirements or some other desired criteria.

Referring to FIG. 7, block 702 is the characterization of the static predistorter 702 using a narrow band signal. In this regard, for example for LTE, the characterization signal is a 5 MHz bandwidth long-term-evolution (LTE) signal, sampled at 122.88 Msps (million samples-per-second). The characterization signal is narrowband, and should model the nonlinearity of the PA such that subsequent stages will not lose accuracy. The signal is sent through the PA with the peak of the time domain signal equal to the saturation power of the PA, resulting in characterization of the PA operating power range. The signal at the output of the PA is down converted and time aligned with the input signal. The parameters (sampling frequency and processing frequency) chosen for $f_{s,sp}=f_{s,adc}=f_{s,dac}$ is equal to 122.88 Msps. After convergence, the static predistorter may be stored in memory, and the multi-band stage of the DPD characterization may be performed.

In an experimental set-up (not shown) the effects of the static predistorters' ability to generate multi-band IMD, a static predistorter was characterized for an amplifier. Two 40 MHz (2×20 MHz) LTE signals were generated, spaced 160 MHz apart. The test signal was created in a dual band configuration with sufficient bandwidth to introduce memory effects. The signal was resampled to $f_{s,sp}=1000$ Msps before applying the static predistorter. Although the static predistorter may not fully remove the effects of the dual-band intermodulation caused by nonlinearity and memory effects, it is able to reduce the intermodulation by approximately 13 dBc using existing information about the PA, and without capturing and modeling them separately. The next step is considering the effects of removing the generated intermodulation on the predistorted output. In one embodiment a filter may be implemented for filtering out the lower IMD generated by the predistorter, the IMD suppression performance at the lower IMD may be reduced, while the upper IMD suppression performance may stay approximately the same. The same effect may be experienced when filtering out the upper IMD. Filtering out both IMDs while leaving the main channels untouched removes the IMD compensation. It may be noted that since the dual band signal was not filtered out, predistortion performance in the main channels remains unaffected regardless of whether the IMDs are sent. Therefore, provided that the sampling frequency $f_{s,sp}$ is able to accommodate the spectral regrowth generated by the predistorter, the predistorter will still be able to linearize the system.

Figure 8:
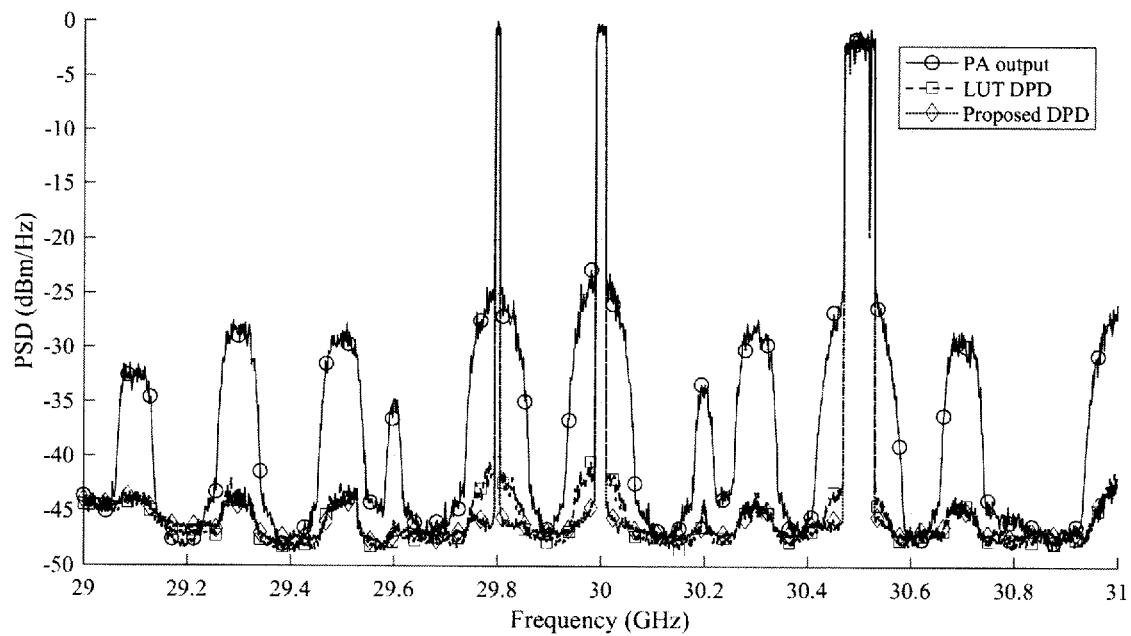
FIG. 8 shows IMD suppression by applying the predistorter of the present matter using filter bank multi-carrier (FBMC) signals.
Figure 9:
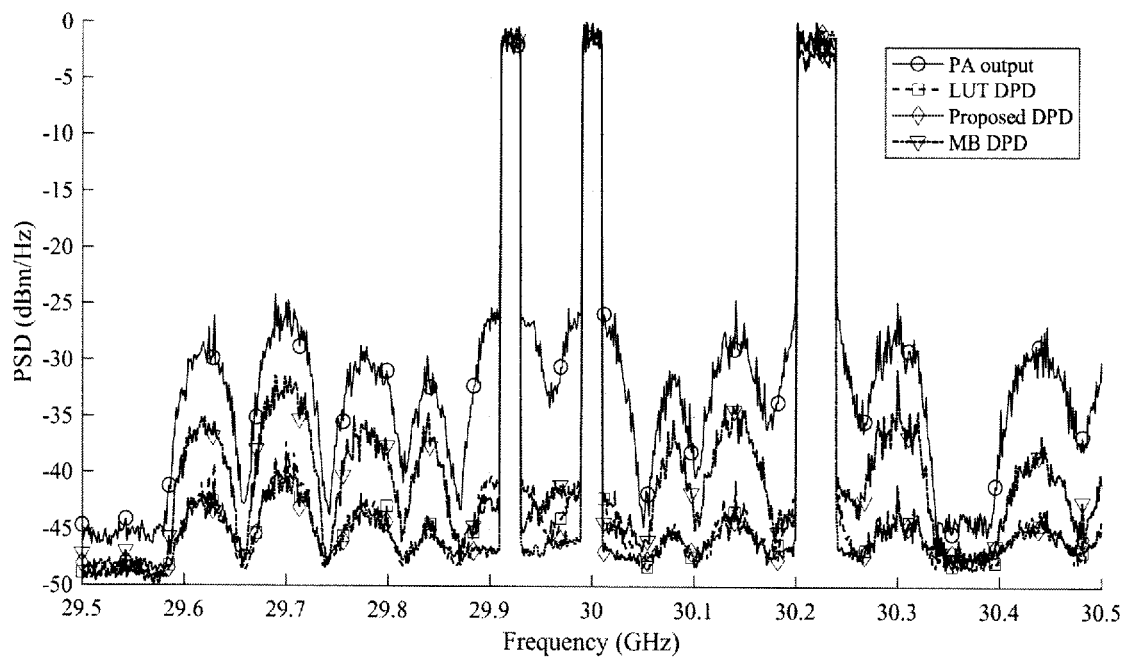
FIG. 9 shows a tri-band scenario applying the predistorter of the present matter using filter bank multi-carrier (FBMC) signals

The embodiments of the present matter may be applied to a variety of applications. For example, filter bank multi-carrier (FBMC) signals are one of the candidates for 5G waveforms. FIG. 8 and FIG. 9 both illustrate results of applying the predistorter of the present matter using a variety of FBMC signals with different bandwidths and carrier frequencies. FIG. 8 shows an IMD suppression of more than 15 dBc compared with the original PA output, highlighting the performance of the herein described DPD architecture.

Utilizing carrier aggregation with off channels between carriers increases the difficulty for multi-band linearization, since it may be difficult to distinguish the relative band output. FIG. 9 shows a tri-band scenario, with the two bands at carrier frequencies of 29.92 GHz and 30 GHz having overlapped spectral regrowth caused by nonlinear distortion. Utilizing solely multi-band predistortion has limited in-band ACPR performance due to the spectral regrowth overlap.

With the static predistorter according to an embodiment of the present matter, the ACPR performance improves enough such that the spectral regrowth does not overlap and multiband DPD performance is increased.

Figure 10:
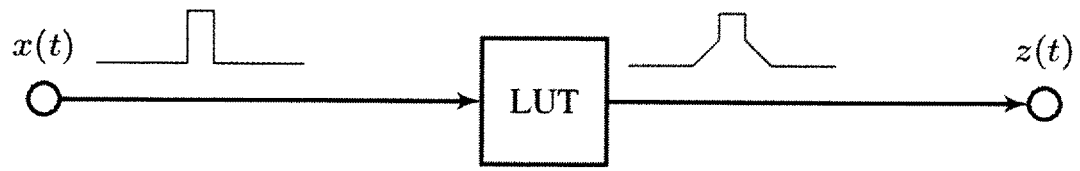
FIGS. 10A-10C show output spectra for a single band implementation of the distortion compensation architecture according to an embodiment of the present matter.
Figure 10:
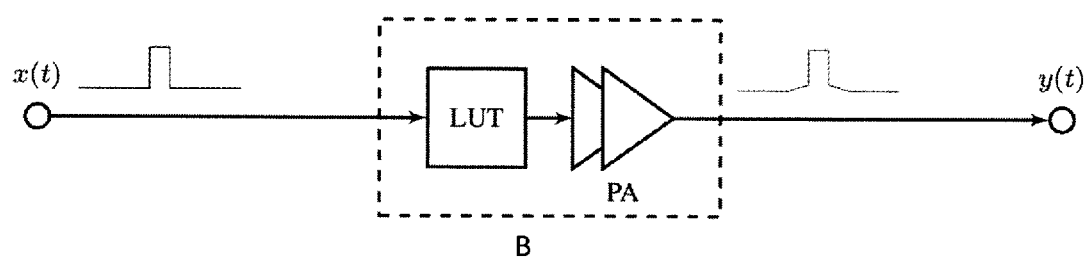
Figure 10:
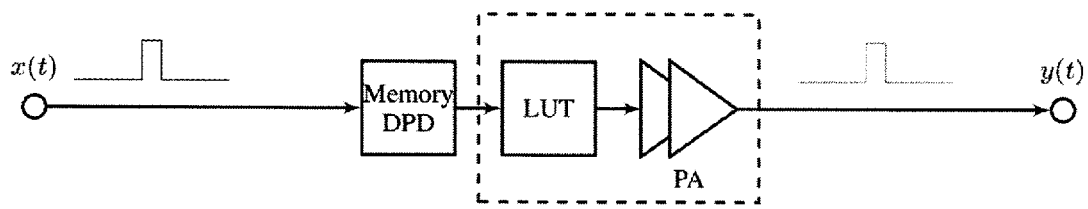

Referring to FIG. 10 there is shown the spectra at different points in an example DPD architecture when fed by a single band input signal, according to an embodiment of the present matter.

Figure 11:
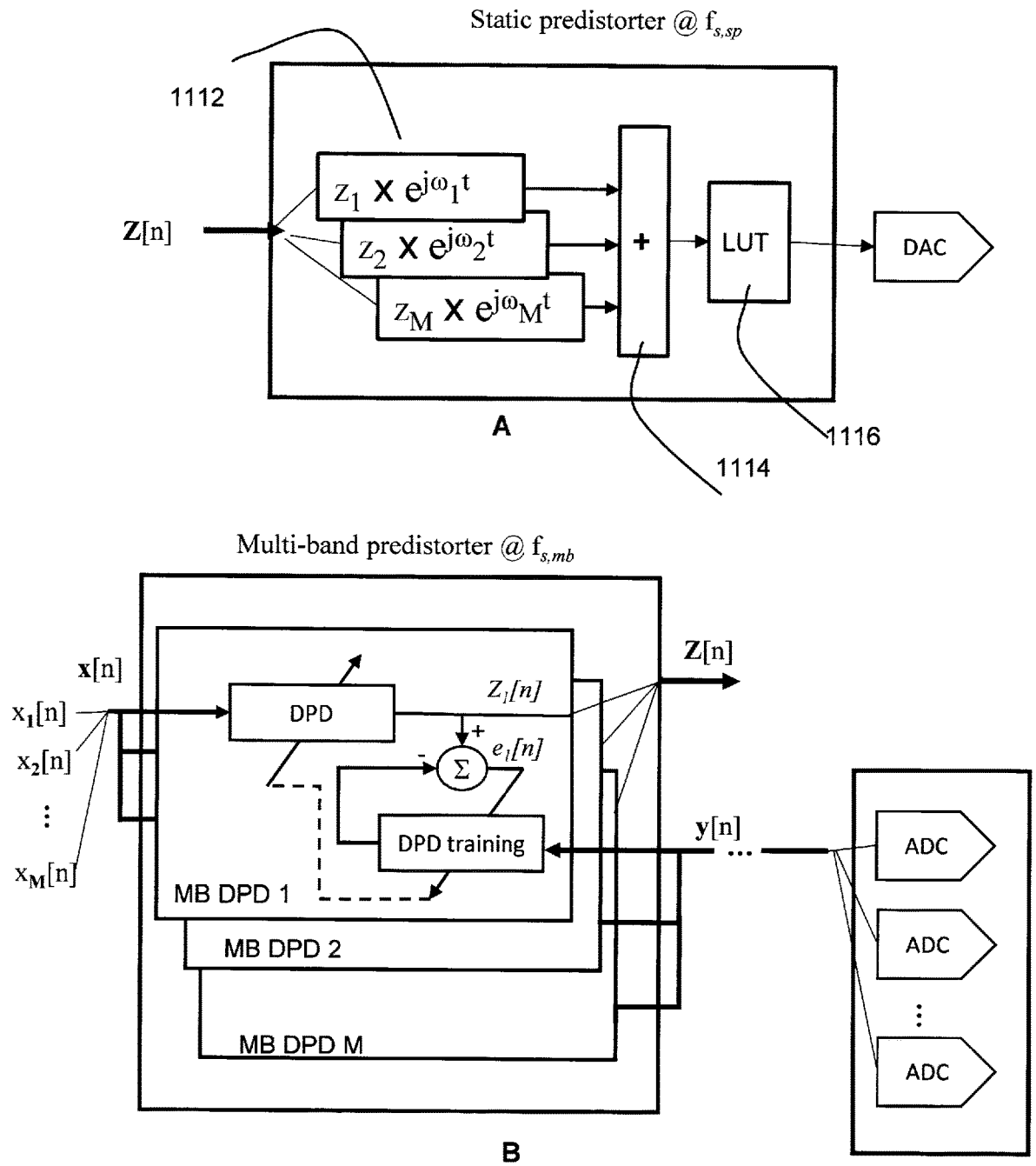
FIG. 11A is a block diagram of a multiband static predistorter according to an embodiment of the present matter.
FIG. 11B is a block diagram of a multiband predistorter according to an embodiment of the present matter

Referring now to FIGS. 11A and 11B there is shown a block diagram of the generalized overall multi-stage DPD architecture according to an embodiment of the present matter. FIG. 11B shows a multiband DPD 1100 which may be cascaded with a static predistorter block 1110 shown in FIG. 11A. In this architecture of multiband DPD there is the added synthesis of the IMDs that are generated with the static predistorter. Since the static the predistorter is memoryless, sampling rates can be changed without consequence to the model. As discussed previously, multi-rate processing is exploited to reduce the sampling rate as much as possible, and to accommodate spectral regrowth from multi-band signals being applied to the static predistorter, which herein acts as the spurious distortion generator and illustrated with the LUT. As discussed previously, most IMD compensation techniques utilize the capture of the distortion at each frequency band. However, as long as the signal processing frequency can accommodate the nonlinearity spectral regrowth caused by the static predistorter, the static intermodulation products can be generated. Considering the amount of signal processing speed may be very large for multi-band signals with large separation bandwidths, two signal processing rates may be utilized: fs;sp for the static predistorter, and fs;mb for the multi-band predistorter. Since this architecture is based on equation (1), the system generates all IMD products. If there is not enough transmitter bandwidth, the output of the LUT can be filtered and sent through separate narrowband transmitters.

In FIG. 11B the MB DPD's (as for example described in FIG. 1) each process a respective one of the baseband multiband signals xi. The predistorted outputs Z may then the be shifted 1112 in the digital domain to their individual carrier frequencies as shown in FIG. 11A. The shifted signals are then summed 1114 and applied to the static DPD, LUT 1116 as illustrated. As may be seen the feedback sampling through the ADC's in FIG. 11B may be reduced due to the reduced out of band distortion components at the output of the PA (not shown).

Further improvements on the spectral regrowth can be made using multi-band digital predistortion. A multiband phase aligned memory polynomial model is used and is derived from "S. A. Bassam, M. Helaoui, and F. M. Ghannouchi, "2-D digital predistortion (2-D-DPD) architecture for concurrent dual-band transmitters," IEEE Trans. Microw. Theory Techn, vol. 59, no. 10, pp. 2547-2553, October 2011" incorporated herein by reference. The formulation can be represented multi-dimensionally for M-bands as follows:

$$\tilde{y}_i(n) = \sum_{p_1=0}^{N_1} \sum_{p_2=0}^{N_1-p_1} \cdots \sum_{p_M=0}^{N_1-(p_1+p_2+\ldots+p_{M-1})} \sum_{q=1}^{Q_1}$$

$$h_{1,p_1,p_2\ldots p_M}^{(i)}(q) \times \tilde{x}_i(n-q) \prod_{j=1}^{M} |\tilde{x}_j(n-q)|^{p_j} +$$

$$\sum_{p_1=0}^{N_2} \cdots \sum_{p_M=0}^{N_2-(p_1+p_2+\ldots+p_{M-1})} \times h_{2,p_1,p_2\ldots p_M}^{(i)}(q) \times \tilde{x}_i(n) \prod_{j=1}^{M} |\tilde{x}_j(n)|^{p_j} +$$

$$\sum_{p_1=0}^{N_3} \cdots \sum_{p_M=0}^{N_3-(p_1+p_2+\ldots+p_{M-1})} \sum_{q=1}^{Q_2}$$

$$h_{3,p_1,p_2\ldots p_M}^{(i)}(q) \times \tilde{x}_i^2(n)\tilde{x}_1^*(n-q) \prod_{j=1}^{M} |\tilde{x}_j(n)|^{p_j}$$

where ~ $y_i(n)$ is the estimated model output at the i-th band. $h(i) 1;p_1p_2 \ldots p_M(q)$, $h(i) 2;p_1p_2\_p_M(q)$, and $h(i)_{3;p1p2\_pM}(q)$ are the set of the coefficients at the i-th band. $N_1$, $N_2$, and $N_3$ are the nonlinearity orders, and $Q_1$ and $Q_2$ are the memory depths. Each i corresponds to a MB DPD blocking FIG. 12, feedback provides the coefficients h to allow the system to adapt.

It may be seen that in the present matter provides in general a multi-band digital predistortion architecture with intermodulation injection which may be used for 4G/5G networks. Utilizing information from a pre-characterized static predistorter allows for the synthesis of the intermodulation products. Although the intermodulation products do not capture of the frequency band, the digital signal processing rate may need to be increased for the intermodulation to lie in the correct frequencies. Results show that these intermodulation components generated by the static predistorter are accurately represented and can be utilized by lower transmitter sampling rates through filtering and resampling. Further improvements on the intermodulation suppression may be made by applying existing techniques that specifically capture and model those components.

The invention claimed is:

1. A digital predistorter comprising:
a first predistorter coupled to receive multiple input signals, and for generating multiple output signals, the first predistorter being configured to compensate for in-band distortion signals around each one of the multiple input signal frequencies;
a frequency distribution network for positioning the multiple output signals from the first predistorter into representative carrier frequencies to generate a multi-band signal; and
a second predistorter coupled to receive the multi-band signal and output a predistorted multi-band signal, the second predistorter generating out-of-band and inter-band distortion remote to frequency bands of the multiple input signals,
wherein the cascade of the first predistorter, the frequency distribution network, and the second predistorter compensate for in-band, out-of-band and inter-band distortions.

2. The digital predistorter of claim 1, wherein
the first predistorter being characterized by use of the multiple input signals and
the second predistorter being characterized by use of a narrowband signal.

3. The digital predistorter of claim 2, the second predistorter being a static predistorter.

4. The digital predistorter of claim 2 including a feed back loop, the feedback loop being used for said characterizing of said first predistorter and said second second predistorter.

5. The digital predistorter of claim 4 wherein the feedback loop is a low speed feedback loop.

6. The digital predistorter of claim 2 wherein the cascade of the first predistorter, the frequency distribution network, and the second predistorter further compensate for memory effects.

7. The digital predistorter of claim 1, wherein the first predistorter compensates for a first nonlinearity in a nonlinear element and the second predistorter compensates for a second nonlinearity in the nonlinear element, and wherein the nonlinear element is one of a single-band amplifier, multiband amplifier, and wideband power amplifier.

8. The digital predistorter of claim 1, wherein the first predistorter compensates for a first nonlinearity in a nonlinear element and the second predistorter compensates for a second nonlinearity in the nonlinear element, and wherein the nonlinear element is one of a single-branch amplifier, multi-branch amplifier, and phased array transmitter.

9. The digital predistorter of claim 1, wherein the first predistorter compensates for a first nonlinearity in a nonlinear element and the second predistorter compensates for a second nonlinearity in the nonlinear element, and wherein the nonlinear element is one of a single-input single-output transmitter, and a multi-input multi-output transmitter.

10. A method for suppressing intermodulation distortion produced by nonlinear elements in a transmission signal path comprising:

generating a first predistorted multiple output signal from multiple input signals, the predistorted multiple output signal having in-band distortion around each one of the multiple input signals;

positioning the predistorted multiple output signals into their representative carrier frequencies to generate a multi-band signal; and generating a second predistorted multi-band signal from the multi-band signal, the second predistorted multi-band signal including out-of-band and inter-band distortions remote to frequency bands of the multiple input signals.

11. The method of claim 10 wherein the nonlinear element is one of a single-band amplifier, multiband amplifier, and wideband power amplifier.

12. The method of claim 10 wherein the nonlinear element is one of a single-branch amplifier, multi-branch amplifier, and phased array transmitter.

13. The method of claim 10 wherein the nonlinear element is one of a single-input single-output transmitter, and a multi-input multi-output transmitter.

* * * * *